(12) United States Patent
Kobayashi

(10) Patent No.: US 8,390,380 B2
(45) Date of Patent: Mar. 5, 2013

(54) LINEAR FET FEEDBACK AMPLIFIER

(75) Inventor: Kevin Wesley Kobayashi, Torrance, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/099,636

(22) Filed: May 3, 2011

(65) Prior Publication Data

US 2011/0291764 A1    Dec. 1, 2011

Related U.S. Application Data

(60) Provisional application No. 61/349,653, filed on May 28, 2010.

(51) Int. Cl.
    $H03F\ 1/34$    (2006.01)
(52) U.S. Cl. ........................................ 330/294; 330/296
(58) Field of Classification Search .................... 330/98, 330/150, 285, 294, 296
    See application file for complete search history.

(56) References Cited

U.S. PATENT DOCUMENTS

| | | | | |
|---|---|---|---|---|
| 4,490,693 A | * | 12/1984 | Behrend | 333/28 R |
| 5,047,731 A | * | 9/1991 | Lee | 330/282 |
| 5,264,806 A | * | 11/1993 | Kobayashi | 330/294 |
| 6,927,634 B1 | | 8/2005 | Kobayashi | |
| 6,933,787 B1 | | 8/2005 | Kobayashi | |
| 6,972,630 B2 | * | 12/2005 | Kobayashi | 330/296 |
| 7,772,927 B1 | | 8/2010 | Shealy et al. | |
| 2003/0155977 A1 | * | 8/2003 | Johnson et al. | 330/290 |

OTHER PUBLICATIONS

Kobayashi, K.W., "Improved efficiency, IP3-bandwidth and robustness of a microwave Darlington amplifier using 0.5µm ED PHEMT and a new circuit topology," 2005 IEEE Compound Semiconductor Integrated Circuit Symposium, Oct. 30-Nov. 2, 2005, pp. 93-96, IEEE.
Kobayashi, K.W., "High Linearity-Wideband PHEMT Darlington Amplifier with +40 dBm IP3," 2006 Asia-Pacific Microwave Conference, Dec. 12-15, 2006, pp. 1035-1038, IEEE.
Kobayashi, K.W., "A Novel E-mode PHEMT Linearized Darlington Cascode Amplifier," 2006 IEEE Compound Semiconductor Integrated Circuit Symposium, Nov. 2006, pp. 153-156, IEEE.
Sirenza Microdevices, "Standard 5 V Medium Power InGaP Darlington Amplifiers," Microwave Journal, Apr. 2005, p. 164, vol. 48, No. 5, Horizon House Publications, Inc.

* cited by examiner

*Primary Examiner* — Henry Choe
(74) *Attorney, Agent, or Firm* — Withrow & Terranova, P.L.L.C.

(57) ABSTRACT

A circuit that includes a Darlington transistor pair having an input transistor and an output transistor configured to generate an output signal at an output node in response to an input signal received through the input node is disclosed. The circuit has a frequency bias feedback network communicatively coupled between the output transistor and the input node for providing biasing to the Darlington transistor pair as well as for adjusting a phase and amplitude of an amplified version of the input signal that passes through the input transistor and into the frequency bias network. The circuit further includes a feedback coupling network coupled between the output node and the input node for feeding back to the input node a portion of the amplified version of the input signal that passes through the input transistor.

25 Claims, 15 Drawing Sheets

LINEAR FET FEEDBACK AMPLIFIER

RELATED APPLICATION

This application claims the benefit of provisional patent application Ser. No. 61/349,653, filed May 28, 2010, the disclosure of which is hereby incorporated herein by reference in its entirety.

FIELD OF THE DISCLOSURE

The present disclosure relates to radio frequency (RF) feedback amplifiers and in particular to a Darlington field effect transistor (FET) feedback amplifier.

BACKGROUND

Wideband Darlington amplifiers with high linearity are standard radio frequency (RF) building blocks for wireless, cable television (CATV), fiber optics, and general purpose RF applications. An important attribute for such applications are high linearity over multi-decade bandwidth operation. One figure of merit for weakly nonlinear systems such as small signal RF amplifiers is known as a third order intercept point (IP3). A relatively high value for IP3 measured in decibels referenced to one milliwatt (dBm) indicates a relatively high linearity for a device or system, whereas a relatively low value for IP3 indicates a relatively low linearity for a device or system. A low linearity for an RF device such as an amplifier or mixer will cause inter-modulation (IM) products to be generated that cannot be filtered out before reaching a receiver.

Darlington amplifiers based upon Indium Gallium Phosphide (InGaP) heterojunction bipolar transistors (HBTs) have demonstrated some of the highest IP3-bandwidth (IP3-BW) values for an RF Darlington feedback amplifier. FIG. 1 is a circuit diagram of a simple embodiment of a prior art self-biased Darlington feedback topology. In particular, the self-biased Darlington feedback amplifier 10 depicted in FIG. 1 includes features disclosed in U.S. Pat. Nos. 6,972,630 and 6,927,634, both of which are entitled "Self-Biased Darlington Amplifier", both of which are incorporated herein by reference in their entirety. Moreover, the self-biased Darlington feedback amplifier 10 has been implemented using Silicon Germanium (SiGe) and Indium Gallium Phosphide (InGaP) heterojunction bipolar transistor technologies as well as enhancement mode (E-mode) pseudomorphic high electron mobility transistor (PHEMT) technology. Robust operation over temperature and process variation is a key advantage of the self-biased Darlington feedback amplifier 10. Moreover, the self-biased Darlington feedback amplifier 10 eliminates the need for an off-chip active bias network such as a positive-negative-positive (PNP) transistor network. Further still, the self-biased Darlington feedback amplifier 10 provides inherent benefits of an intermediate frequency (IF) or beat tone cancellation through negative feedback. The self-biased Darlington feedback amplifier 10 also includes a unique ability of enabling class B biasing, which is not possible with traditional Darlington feedback amplifiers that use a resistive bias network that restrict traditional Darlington amplifiers to class A operation.

In particular, the self-biased Darlington amplifier 10 illustrates a basic embodiment prior art self-biased Darlington feedback topology. A main amplifier section 12 may be implemented with a transistor Q1 and a transistor Q2. A bias section (or circuit) 14 is generally connected between the emitter and base of the transistor Q1. The bias section 14 is implemented as a self-biased feedback circuit. The self-biased Darlington amplifier 10 also comprises parallel feedback resistor RFB, a series feedback resistor REE2, and bias resistor REE1. The bias resistor REE1 is used to bias the transistor Q1. The self-biased feedback circuit 14 is used to stabilize the bias of the self-biased Darlington amplifier 10 without relying on an external resistor.

The self-biased feedback circuit 14 generally comprises a resistor RDC, a transistor $Q_{BIAS}$, a resistor $R_{ISO}$, a resistor $REE_{BIAS}$ and a capacitor $C_{BYP1}$. The resistor RDC is implemented as an RF blocking resistor. The transistor $Q_{BIAS}$ is implemented as a biasing transistor. The resistor $R_{ISO}$ is implemented as an RF isolation for preventing RF or intermediate frequency IF signals from being fed back to the base of transistor Q1. The emitter biasing resistor $REE_{BIAS}$ may be coupled between the emitter of the transistor $Q_{BIAS}$ and a fixed voltage node such as ground. The capacitor $C_{BYP1}$ is implemented as an alternating current (AC) bypass capacitor. The transistor $Q_{BIAS}$ generally operates as a pseudo mirror bias transistor of the transistor Q2. The bias section 14 generally works in conjunction with the parallel feedback resistor RFB to set up a reference current IBB. The current IBB is approximately mirrored to the output transistor Q2 as a bias current ICC2. The relationship between IBB and ICC2 is only approximate, but generally mirror each other in current over temperature, supply voltage, and input drive level variations. The ratio of the areas of the transistor $Q_{BIAS}$ and the transistor Q2, and the emitter resistors $REE_{BIAS}$ and REE2, are generally scaled in proportion to the bias currents IBB and ICC2, respectively. For example, if the bias current IBB is 1 mA and the bias current ICC2 is 100 mA, then the area of the transistor $Q_{BIAS}$ may be implemented as 1/100th of the area of the transistor Q2. The resistor $REE_{BIAS}$ will approximately be one hundred times the value of the resistor REE2. However, other ratios may be implemented to meet the design criteria of a particular implementation.

The values of the resistor RDC and the resistor $R_{ISO}$ are generally chosen for optimum RF performance versus DC bias sensitivity. For optimal RF performance, the resistor $R_{ISO}$ should typically be greater than about 10Ω but less than about 1,000Ω. The value of the resistor RDC should typically be greater than about 10Ω but less than about 10,000Ω. DC stability may be relaxed in favor of RF performance or vice versa to obtain combinations outside of these ranges.

The bypass capacitor $C_{BYP1}$ and the blocking resistor RDC set a lower frequency limit of operation. The lower frequency limit of operation may be extended by increasing either or both values of the capacitor $C_{BYP1}$ and the resistor RDC. However, increasing the value of the resistance of the resistor RDC will generally degrade the bias mirroring relationship between the transistor $Q_{BIAS}$ and the transistor Q2. The self-biased amplifier 10 resembles a type of DC current mirror, except that the self-biased Darlington amplifier 10 provides a well defined RF input terminal IN and a well defined RF output terminal OUT. The DC mirror operation is less than ideal due to the RF blocking resistor RDC.

FIG. 2 shows a prior art E-mode PHEMT implementation of the self-biased Darlington feedback amplifier 10 (FIG. 1). A field effect transistor (FET) based self-biased Darlington feedback amplifier 16 includes transistors $M_1$, $M_2$ and $M_3$. E-mode PHEMT devices are chosen for the transistors $M_1$, $M_2$ and $M_3$ because a positive gate to source threshold voltage VGS of E-mode PHEMT devices enables positive supply operation of self-biased Darlington feedback amplifiers. In contrast, depletion mode (D-mode) PHEMT devices are not usable for the transistors $M_1$, $M_2$, and $M_3$, because D-mode devices do not work properly with the FET based self-biased Darlington feedback amplifier 16. Moreover, E-mode PHEMT FETs have low parasitic characteristics that allow greater IP3-BW performance as compared to traditional SiGe and InGaP HBT Darlington RF feedback amplifiers. For example, FIG. 3 illustrates a significantly flat response for IP3 over a wideband of frequencies for E-mode PHEMT based Darlington amplifiers, whereas InGaP HBT Darlington amplifiers experience a relatively sharp roll-off over the same wideband frequencies, given a similar bias voltage and current operation.

Turning back to FIG. 2, the transistors $M_1$, $M_2$, and $M_3$ are FET devices that have an order of magnitude lower input capacitance CGS in comparison to a bipolar or HBT device for a similar bias current level. A smaller set of parasitic capacitances help preserve a desirable 180 degree negative feedback at an upper edge of the wideband frequencies of operation. A non-ideal feedback that is less than or greater than 180 degrees at the upper edge of the wideband frequencies of operation will yield a vector feedback that departs from the desirable 180 degree negative feedback. This less than desirable negative feedback is a result of excessive parasitic device capacitance that produces feedback signal phase shifts that result in less than desirable negative feedback distortion cancellation.

In greater detail, the FET based self-biased Darlington feedback amplifier 16 includes a main amplifier section 18 that is implemented with the transistor $M_1$ and a transistor $M_2$. A FET bias section 20 is communicatively coupled between the drain of the transistor $M_1$ and gate of the transistor $M_2$. The FET bias section 20 is implemented as a self-biased feedback circuit. The FET based self-biased Darlington feedback amplifier 16 also comprises the parallel feedback resistor RFB, a series feedback resistor $R_{SS2}$, and bias resistor $R_{SS1}$. The bias resistor $R_{SS1}$ is used to bias the transistor $M_1$. The self-biased feedback circuit 20 is used to stabilize the bias of the FET based self-biased Darlington feedback amplifier 16 without relying on an external resistor. A resistor $R_{GM}$ serves the function of RDC (FIG. 1) and the capacitor $C_G$ serves the function of $C_{BYP1}$ (FIG. 1). A capacitor $C_{BYPASS}$ coupled between a power supply rail $V_{DD}$ and ground GND filters power that supplies the FET based self-biased Darlington feedback amplifier 16. An inductor $L_{CHOKE}$ prevents RF signals that are amplified by the FET based self-biased Darlington feedback amplifier 16 from passing to GND through either $V_{DD}$ or the capacitor $C_{BYPASS}$.

FIG. 4 depicts a prior art linearized Darlington cascode amplifier 22 for addressing the non-ideal phase due to parasitic capacitances and parasitic inductances. In particular, the linearized Darlington cascode amplifier 22 generally comprises an amplifier section 24, a reference voltage generation circuit 26, and resistors RFB, RBB, RE1, and RE2. The amplifier section 24 generally comprises a transistor Q1, and a transistor Q2. The resistor RFB is a parallel feedback resistor. The resistor RE2 is a series feedback resistor. The resistors RE1 and RBB are bias resistors.

A transistor Q3 is a common base transistor. The transistor Q3 generally acts to increase the breakdown voltage and bandwidth of the amplifier section 24 and also compensates for an open-loop insertion phase of the amplifier section 24, which is dependent on the impedance characteristic of the reference voltage generation circuit 26 coupled to the base of the transistor Q3.

The reference voltage generation circuit 26 is a frequency dependent voltage reference circuit. The reference voltage generation circuit 26 may include an emitter follower (not shown), and at least one inductive element (not shown). The inductive element helps to provide a desirable frequency dependent impedance to the base of the common-base transistor Q3. Further elements can be added to the inductive element to construct a resistor-inductor-capacitor (RLC) network for optimizing gain-bandwidth, IP3, and/or stability performance. By choosing an appropriate combination of the RLC network, the broadband impedance of the reference voltage generation circuit 26 may be tailored to create an optimal impedance and phase at the collector of the transistor Q3, which generally results in improved broadband IP3 performance.

FIG. 5 is a graph that provides an IP3 comparison between a conventional Darlington amplifier (not shown) and the linearized Darlington cascode amplifier 22 (FIG. 4). In comparison to a conventional Darlington amplifier, the linearized Darlington cascode amplifier 22 provides higher IP3 values from about 2 GHz out to about 16 GHz. In the particular example of FIG. 5, a maximized IP3 improvement value is about 7 dBm at about 12 GHz. Overall, the measured IP3 data shows about an 80% improvement in IP3-BW product.

SUMMARY

In general, a linear FET feedback amplifier that is in accordance with the present disclosure includes a Darlington transistor pair having an input transistor and an output transistor configured to generate an output signal at an output node in response to an input signal received through the input node. The linear FET feedback amplifier also includes a frequency bias feedback network communicatively coupled between the output transistor and the input node for providing biasing to the Darlington transistor pair. The frequency bias feedback network is also usable for adjusting a phase and amplitude of an amplified version of the input signal that passes through the input transistor and into the frequency bias feedback network. The linear FET feedback amplifier also includes a feedback coupling network coupled between the output node and the input node for feeding back to the input node a portion of the amplified version of the input signal that passes through the input transistor. In at least one embodiment, the portion of the amplified version of the input signal that passes through the input transistor is phase and amplitude adjusted. In particular, the frequency bias feedback network passes portions of RF and/or intermediate frequency (IF) signals to the input node via the feedback coupling network. Moreover, in at least one embodiment, the output signal at the output node is fed back to the input node via the feedback coupling network.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
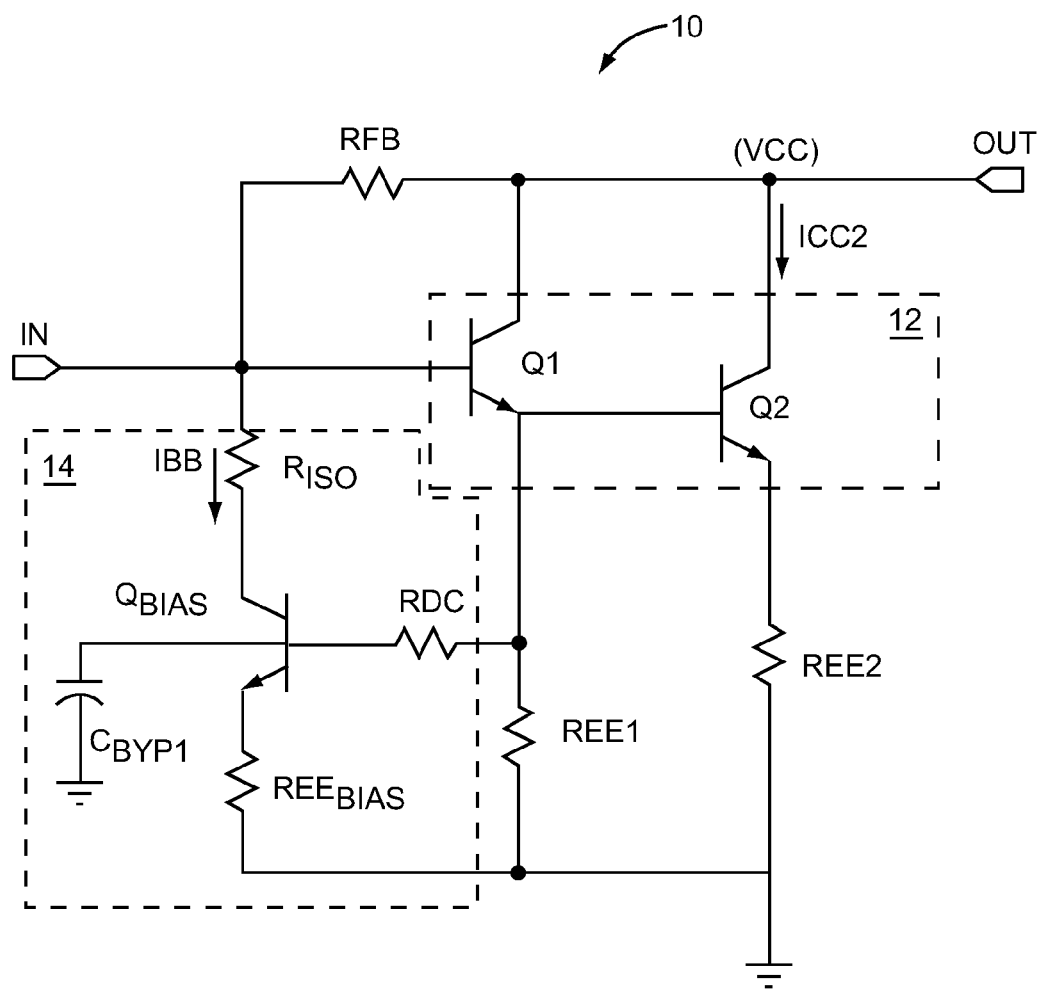
FIG. 1 is a circuit diagram of a simple embodiment of a prior art self-biased Darlington feedback topology.
Figure 2:
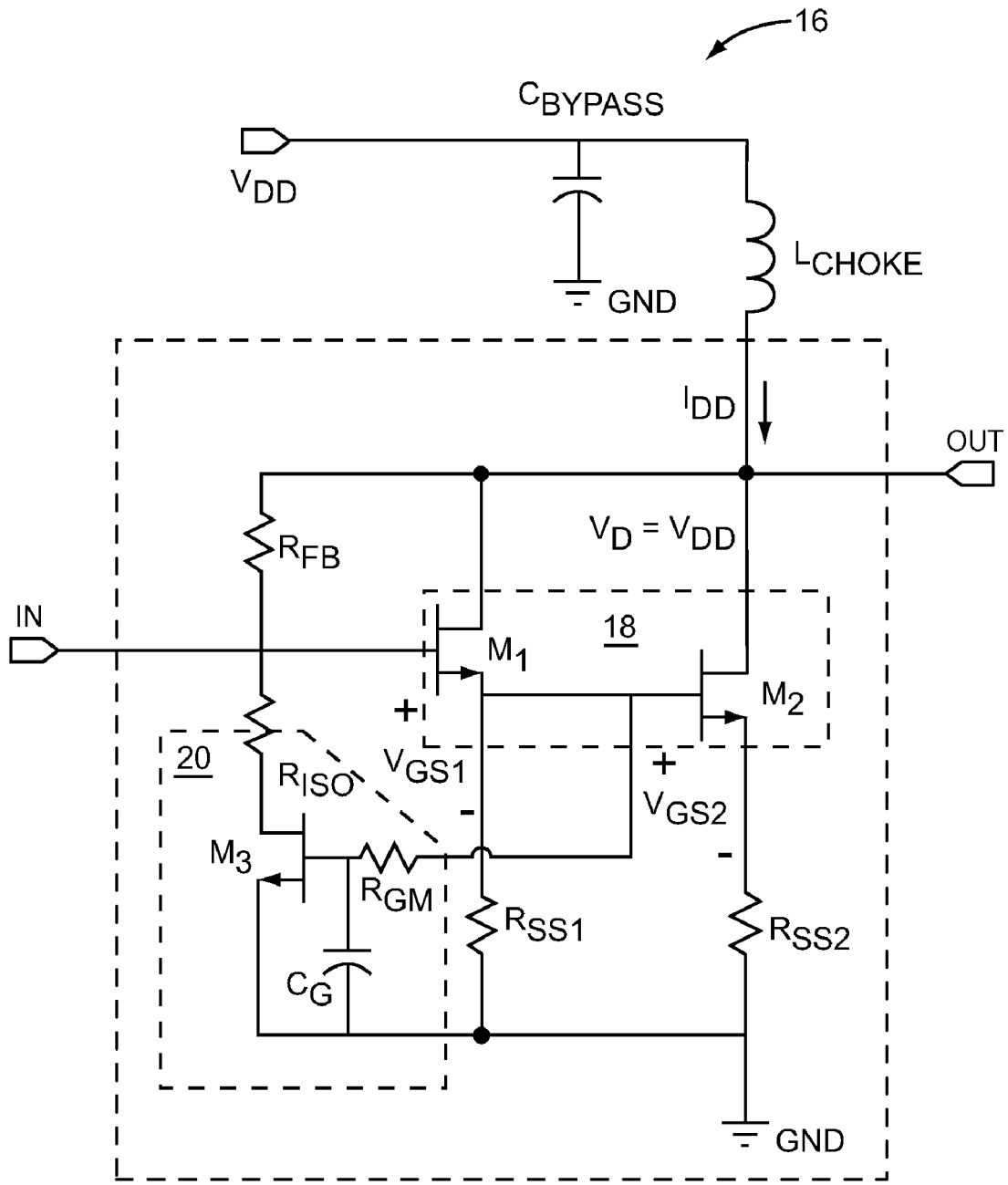
FIG. 2 is a circuit diagram of a prior art enhancement mode (E-mode) pseudomorphic high electron mobility transistor (PHEMT) implementation of the self-biased Darlington feedback topology of FIG. 1.
Figure 3:
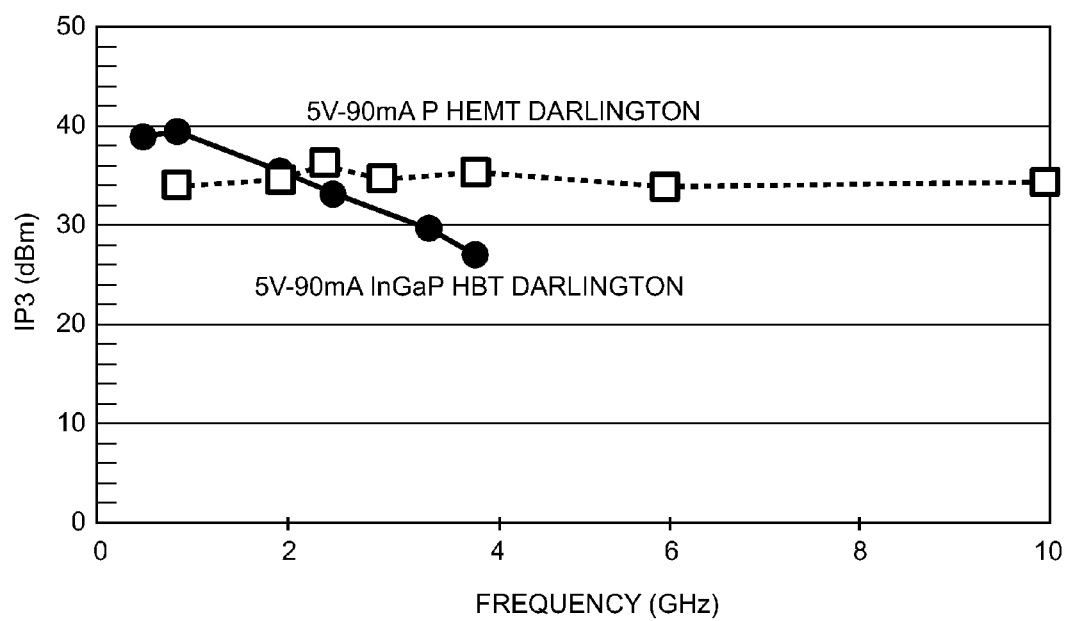
FIG. 3 is a graph that provides a third order intercept (IP3) comparison between an E-mode PHEMT Darlington circuit and an Indium Gallium Phosphide (InGaP) heterojunction bipolar transistor Darlington circuit.
Figure 4:
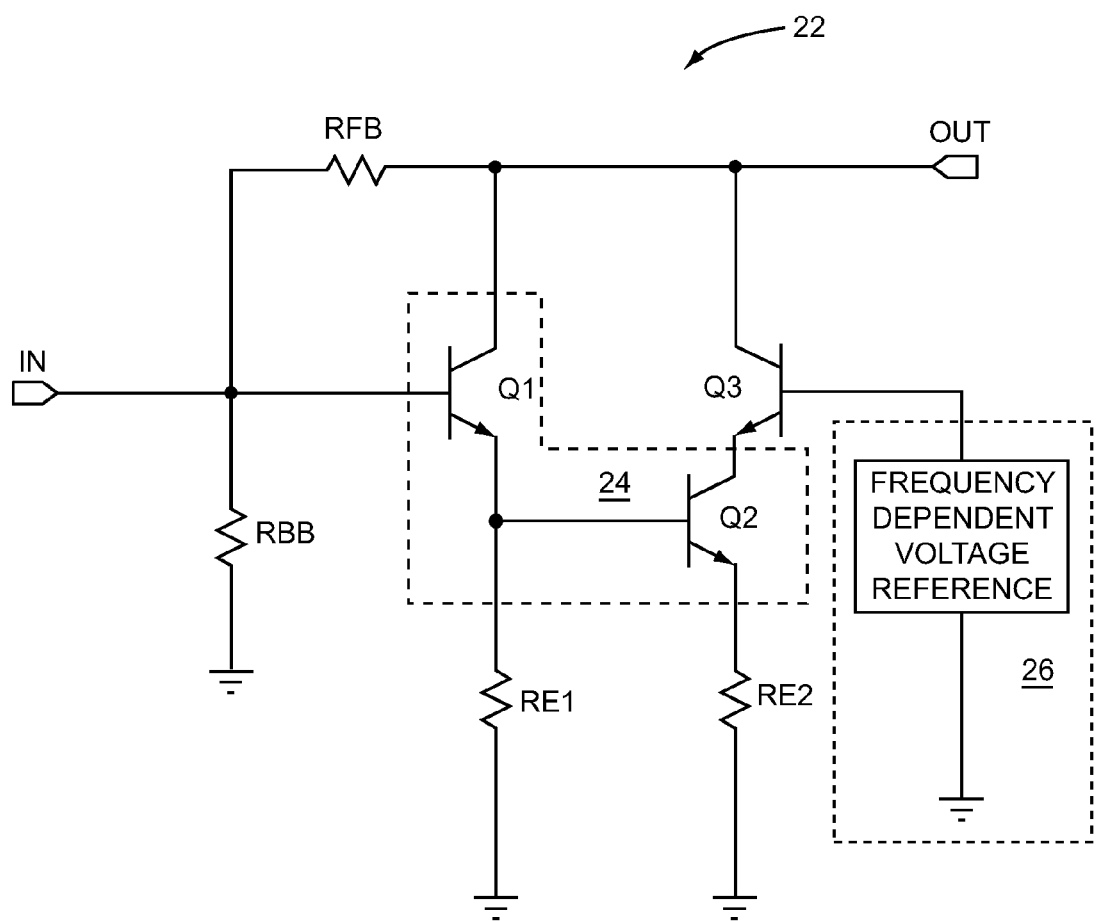
FIG. 4 is a circuit diagram of a prior art linearized Darlington amplifier having a common base cascode transistor including a frequency dependent voltage reference.
Figure 5:
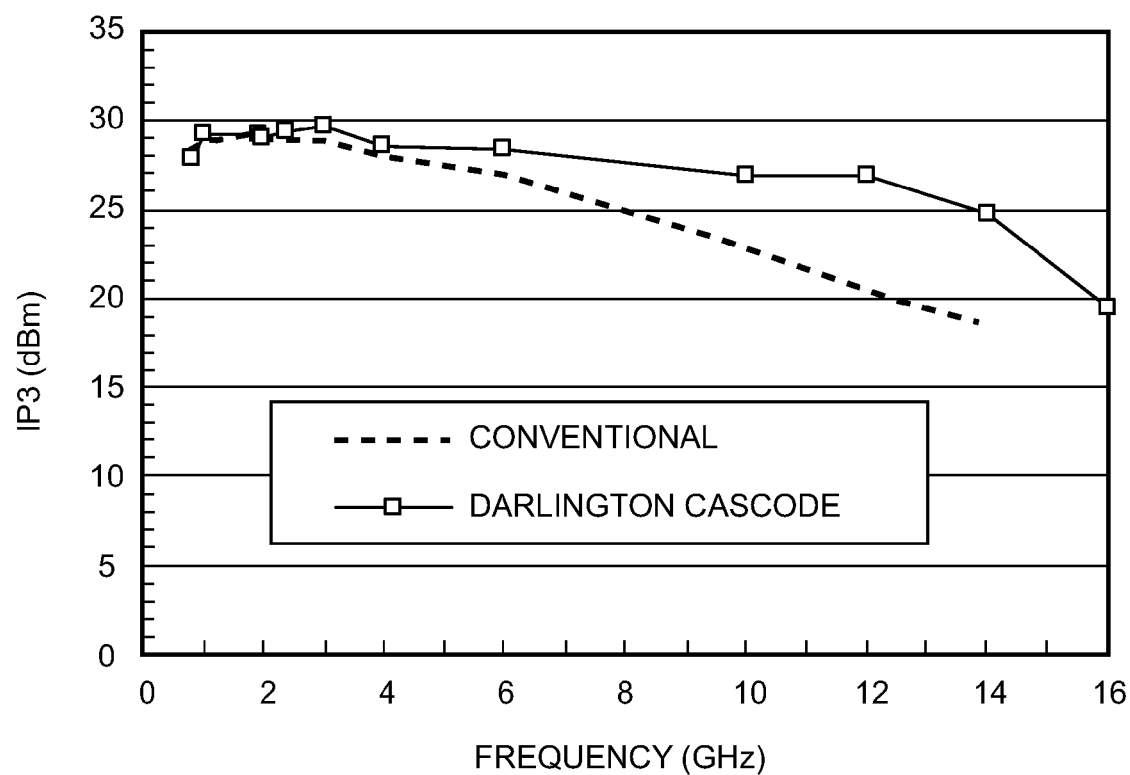
FIG. 5 is a graph that provides a third order intercept point (IP3) comparison between a conventional Darlington amplifier (not shown) and the linearized Darlington amplifier having a common base cascode transistor of FIG. 4.

While the prior art circuits depicted in FIGS. 1, 2 and 4 provide good results for many applications, embodiments of the present disclosure provide even greater improvements for IP3-BW over a wideband frequency range while operating under harsh conditions such as a wide temperature range that may be experienced during operation.

Figure 6:
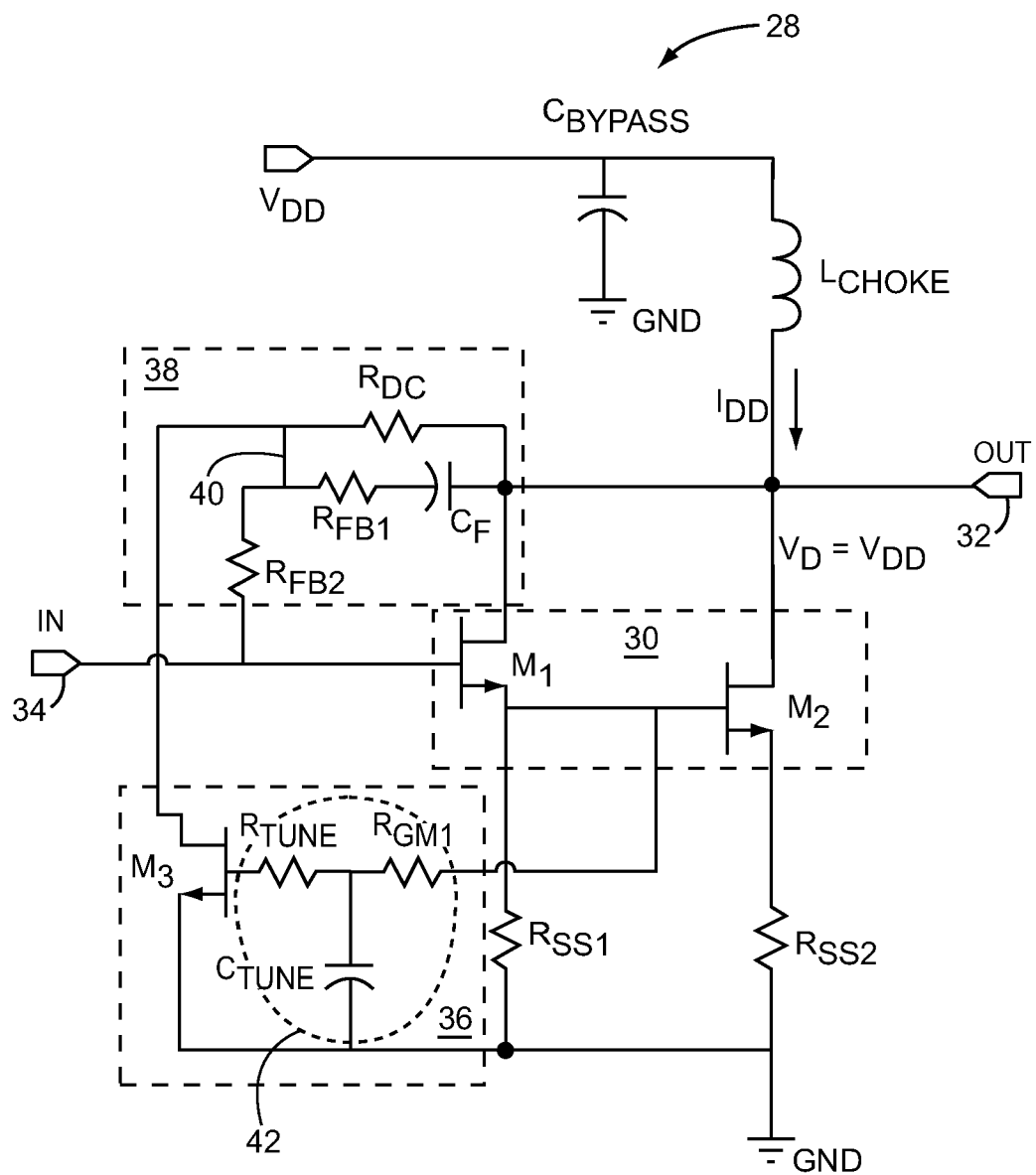
FIG. 6 is a circuit diagram of a simplified embodiment of a linearized field effect transistor (FET) feedback amplifier according to the present disclosure.

FIG. 6 depicts a simplified embodiment of a linear FET feedback amplifier 28 that in accordance with the present disclosure includes a Darlington transistor pair 30 having an input transistor $M_1$ and an output transistor $M_2$ configured to generate an output signal at an output node 32 in response to an input signal received through an input node 34. The linear FET feedback amplifier 28 also includes a frequency bias feedback network 36 that is communicatively coupled between the gate of the output transistor $M_2$ and the input node 34 for providing biasing to the Darlington transistor pair 30. The frequency bias feedback network 36 is also used for adjusting a phase and amplitude of an amplified version of the input signal that passes through the input transistor $M_1$ and into the frequency bias feedback network 36. A feedback coupling network 38 is coupled between the output node 32 and the input node 34 for feeding back to the input node 34 a portion of the amplified version of the input signal that passes through the input transistor. In particular, the frequency bias feedback network 36 passes portions of RF and/or intermediate frequency (IF) signals to the input node 34.

In greater detail, a tuning resistor $R_{TUNE}$ combined with the gate to source (Cgs) capacitance of the bias transistor $M_3$ makes up a low pass filter that is in cascade with a resistor-capacitor (R-C) network made up of a tuning capacitor $C_{TUNE}$ and a filter resistor $R_{GM1}$. An adjustment of the resistance value of tuning resistor $R_{TUNE}$ and/or the capacitance value of the tuning capacitor $C_{TUNE}$ can change the phase and amplitude of the RF and IF signals originating from the source of the input transistor $M_1$, and in turn are applied to the gate of the bias transistor $M_3$. The bias transistor $M_3$ inverts and amplifies the RF and IF signals as well as DC signals that are coupled to the input node 34 through a feedback coupling network 38. The phase of the RF and IF signals that are fed back to the input node 34 may be tuned by the tuning capacitor $C_{TUNE}$ and the tuning resistor $R_{TUNE}$ in order to produce cancelled intermodulation (IM) distortion at the output node 32. Moreover, the bias transistor $M_3$ can create additional IM products with advantageous phase and amplitude characteristics that can reduce the IM distortion at the output node 32. The tuning resistor $R_{TUNE}$ and the tuning capacitor $C_{TUNE}$ are tunable to optimize the phase and amplitude of an RF spectrum that includes, but is not limited to desired tones, third order intermodulation (IM3) tones and beat tones that are coupled to the input node 34 and amplified by the bias transistor $M_3$. An upper frequency band linearity of the linear FET feedback amplifier 28 can be increased by as much as 10 dB by tuning the resistor $R_{TUNE}$ to around 150Ω. Comparatively, a lower to mid-band linearity of the linear FET feedback amplifier 28 may be improved by 3 dB to 5 dB by decreasing the value of capacitance for the capacitor $C_{TUNE}$ by about 1 pF.

The feedback coupling network 38 includes a split feedback resistor tap point 40 for a pair of split feedback resistors made up of a first feedback resistor $R_{FB1}$ and a second feedback resistor $R_{FB2}$. A feedback capacitor $C_F$ blocks DC signals and the resistor RDC implements a DC bias set. The split feedback resistor tap point 40 is usable to adjust the amount of RF and IF signal being fed back to the input of the amplifier in order to optimize desired linearity cancellation at RF and IF frequencies. The total value of the first feedback resistor$_{RFB1}$ and the second feedback resistor $R_{FB2}$ generally sets the RF gain-bandwidth of the linear FET feedback amplifier 28. By adjusting the first feedback resistor $R_{FB1}$ to be proportionally larger than the second feedback resistor $R_{FB2}$, more of the RF-IF-DC feedback signals output from the bias transistor $M_3$ will be fed back to the input node 34. If the first feedback resistor $R_{FB1}$ is proportionally smaller than the second feedback resistor $R_{FB2}$ a smaller amount of will be fed back will be fed back to the input node 34 from the bias transistor M3. As a result, more of the RF-IF-DC feedback signals will be directed toward the output node 32. Thus, the split feedback resistor tap point 40 provides another way to control the amplitude of the RF-IF-DC feedback signals.

In one embodiment, the tuning resistor $R_{TUNE}$, the tuning capacitor $C_{TUNE}$, and the filter resistor $R_{GM1}$ make up a resistor-capacitor-resistor (R-C-R) low pass network 42. The tuning resistor $R_{TUNE}$, the tuning capacitor $C_{TUNE}$, and the filter resistor $R_{GM1}$ are each sized such that a pass pole allows a majority of the IF signal or beat tone (f1-f2) signal to pass through to the gate of the bias transistor $M_3$. A pass frequency may be in the range of 5-10 MHz in order to allow the passage of IM resulting from wideband communication modulation with minimum attenuation. The RF and IF signals passing through the R-C-R low pass network 42 are inverted by the bias transistor $M_3$ and coupled to the input node 34 through the feedback coupling network 38. In this way a negative feedback from DC to an IF frequency for cancelling unwanted beat frequencies is generated. The RF and IF signals passing through the R-C-R low pass network 42 will experience amplitude changes and a phase shift that can be optimized to generate fundamental and IM products (f1, f2, 2f1-f2, 2f2-f1) through the bias transistor $M_3$ where the net result will be the cancellation of distortion at the output node 32. The tuning resistor $R_{TUNE}$ is a primary component for tuning RF and IF signal phases introduced to the gate of the bias transistor $M_3$. The tuning resistor $R_{TUNE}$ allows phase and amplitude tuning control since the value of resistance for the tuning resistor $R_{TUNE}$ creates a second low pass filter pole with the input capacitance (Cgs) of the bias transistor $M_3$.

As mentioned above, the R-C-R low pass network 42 is a preferred and low cost implementation of a more general function of phase and amplitude control. It should be appreciated that other passive components such as inductors (not shown) can be employed in place of one or more of the filter resistor $R_{GM1}$, the tuning capacitor $C_{TUNE}$, and the resistor $R_{TUNE}$ to achieve phase and amplitude control of the frequency bias feedback network 36. Moreover, the R-C-R low pass network 42 is simplified to a simple resistor capacitor (RC) network by combining the resistances of the filter resistor $R_{GM1}$ and the resistor $R_{TUNE}$.

The resistor $R_{TUNE}$ and the tuning capacitor $C_{TUNE}$ are sized to provide a low pass filter (LPF) transfer function that allows the adjustment of the phase and amplitude of RF signals and IF signals being fed back to the input node 34. By reducing $C_{TUNE}$ and/or increasing $R_{TUNE}$, the phase and amplitude can be adjusted at the RF frequency for optimizing the RF signal and IM3 signal phase and amplitude that is fed back to the input of the amplifier through the inverting bias transistor $M_3$, and the coupling network. In one preferred embodiment of the linear FET feedback amplifier 28 (FIGS. 6 and 7), the resistor $R_{TUNE}$ may be 100Ω.

In the prior art self-biased Darlington feedback amplifier 10 (FIG. 1), $C_{BYP1}$ (FIG. 1) is a relatively large capacitor that bypasses, and effectively isolates RF signals from modulating the bias transistor $M_3$ in order to prevent the generation of unwanted non-linearity. In contrast, the value of $C_{TUNE}$ and a non-zero value $R_{TUNE}$ of the linear FET feedback amplifier 28 effectively provides a phase and amplitude shift of the RF and IF signals presented to the base of the bias transistor $M_3$ which generates RF products that have phase and amplitude characteristics which help reduce the IM distortion at the output of the amplifier.

Figure 7:
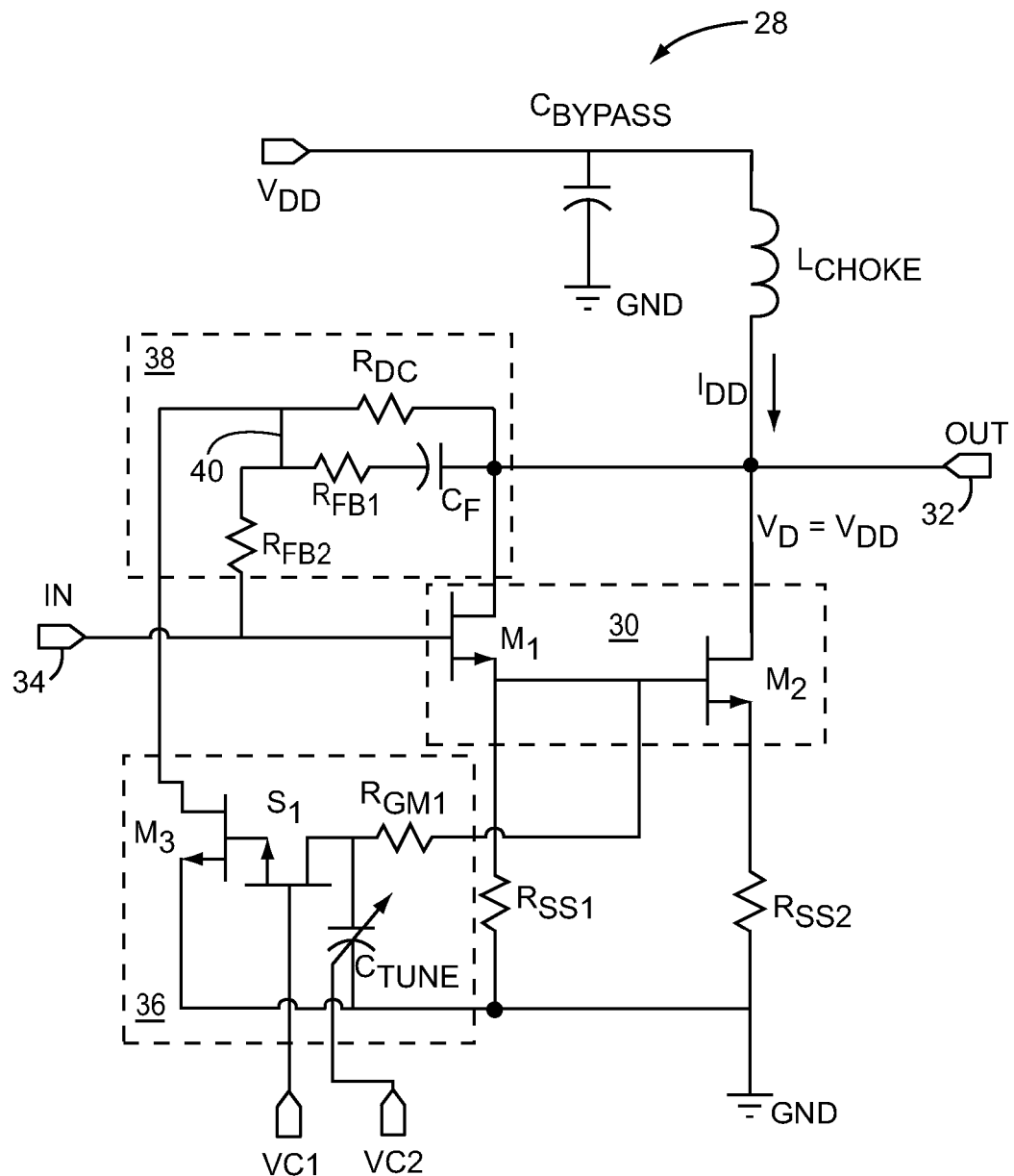
FIG. 7 is a circuit diagram of a simplified embodiment of the linear FET feedback amplifier including electronic tuning in accordance with the present disclosure.

The R-C-R low pass network 42 comprised of the filter resistor $R_{GM1}$, the tuning capacitor $C_{TUNE}$, and the resistor $R_{TUNE}$ may be replaced by electronic devices that provide a phase shifter and amplitude attenuator. FIG. 7 depicts an adaptation of the linear FET feedback amplifier 28 that provides electronic tuning control for the frequency bias feedback network 36 in accordance with the present disclosure. In this particular embodiment, the resistor $R_{TUNE}$ is replaced with a FET varistor S1 that has a variable resistance that is electronically controllable via a first control signal VC1. Moreover, in this embodiment the capacitor $C_{TUNE}$ has a variable capacitance that is electronically controllable via a second control signal VC2. In this way, the R-C-R low pass network 42 becomes an electronically controllable phase shifter and amplitude attenuator. The variable capacitance version of $C_{TUNE}$ may be, but is not limited to a variable capacitor in the form of a varactor diode and a switchable capacitor array. By adjusting the first control signal VC1 and/or the second control signal VC2, linearity versus frequency profile may be tuned for a desired frequency response. As such, electronically controllable phase shifter and amplitude attenuator.

It is important to note that other embodiments of linear FET feedback amplifiers in accordance with the present disclosure may only include the FET variable resistor (varistor) S1 or may only include the electronically controllable version of the capacitor $C_{TUNE}$. In a case in which only the FET varistor S1 is used, the capacitor $C_{TUNE}$ will have a fixed capacitance value. Alternately, if the electronically controllable version of the capacitor $C_{TUNE}$ is used, the FET varistor S1 is replaced with the resistor $R_{TUNE}$ (FIG. 6), which has fixed resistance value.

Figure 8:
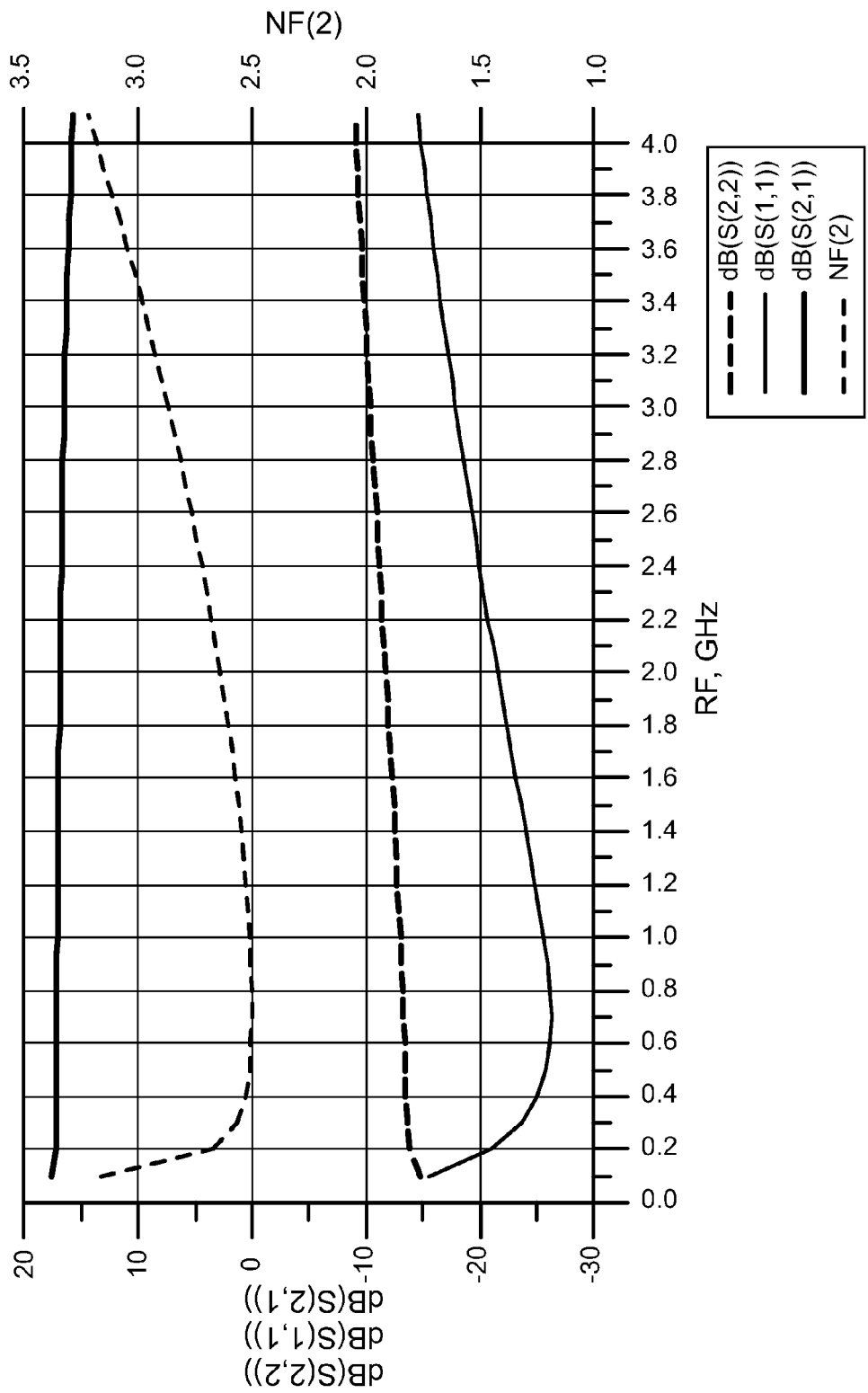
FIG. 8 is a graph depicted nominal broadband performance of the E-mode PHEMT of FIG. 6.

FIG. 8 is a graph depicting nominal broadband performance of the linear FET feedback amplifier 28 of FIG. 6. The left side vertical axis of the graph represents dB units for the magnitude data for the scattering parameters S11, S21 and S22. The right side vertical axis of the graph represents dB units for noise figure (NF) data for the linear FET feedback amplifier 28.

The scattering parameter S21 representing forward gain shows about a 15.5 dB gain with a 3 dB bandwidth (BW) that is greater than 4 GHz, which is sufficient for many of the popular wireless frequency bands such as the long term evolution (LTE) Advanced frequency bands. As shown in the graph of FIG. 8, the NF data for the linear FET feedback amplifier 28 is relatively good being less than 3 dB from about 0.2 GHz to about 3.6 GHz. Moreover, the input return-loss (i.e., S11) is excellent being less than −15 dB across the entire frequency range of 0.1 GHz to 4.0 GHz. Further still, the output return-loss (i.e., S22) is relatively good being below −10 dB from about 0.1 GHz to about 3.2 GHz.

Figure 9:
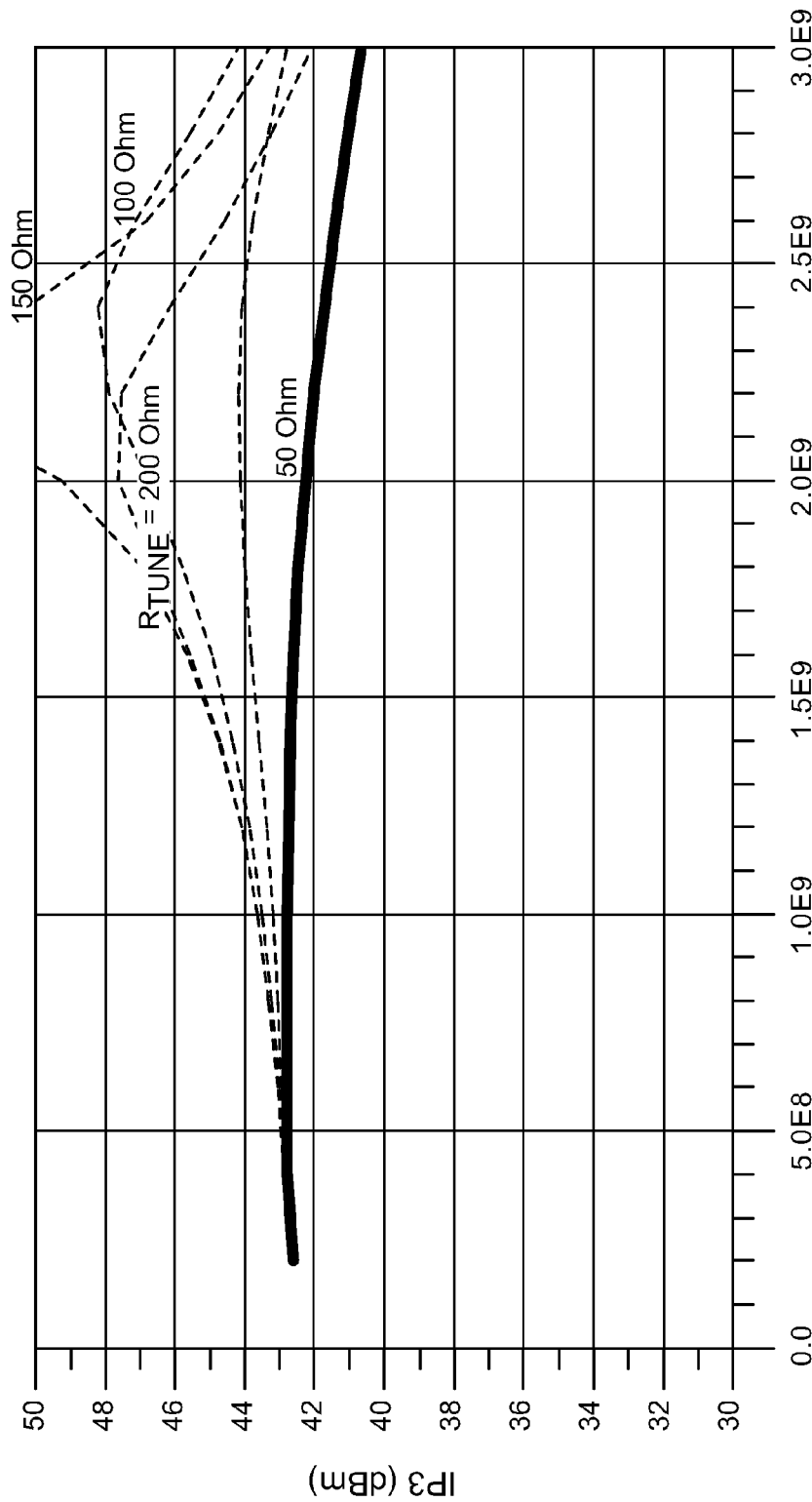
FIG. 9 is a graph showing IP3 simulations for a frequency bias feedback network of FIG. 6 having a fixed tuning capacitor value and swept resistance values for a tuning resistor.

FIG. 9 is a graph showing IP3 simulations for the frequency bias feedback network 36 (FIGS. 6 and 7) having a fixed tuning capacitor value and swept resistance values for a tuning resistor. In particular, the graph of FIG. 9 shows simulated IP3 versus frequency response for the linear FET feedback amplifier 28 (FIG. 6). A fixed value of 10 pF for $C_{TUNE}$ was used for the simulation. Two tone IP3 measurements were performed with a difference frequency of 1.3 MHz with output tones of 0 dBm. The FIG. 9 graph shows the IP3 vs. frequency performance for various values of $R_{TUNE}$ and compares the various improvements to a baseline case where $R_{TUNE}$ is set to zero Ohms. At a frequency of 2.3 GHz, the optimum $R_{TUNE}$ value is 150Ω, which achieves over 8 dB of IP3 improvement. At an $R_{TUNE}$ of 100Ω, the IP3 improvement is a relatively high 6 dB.

Figure 10:
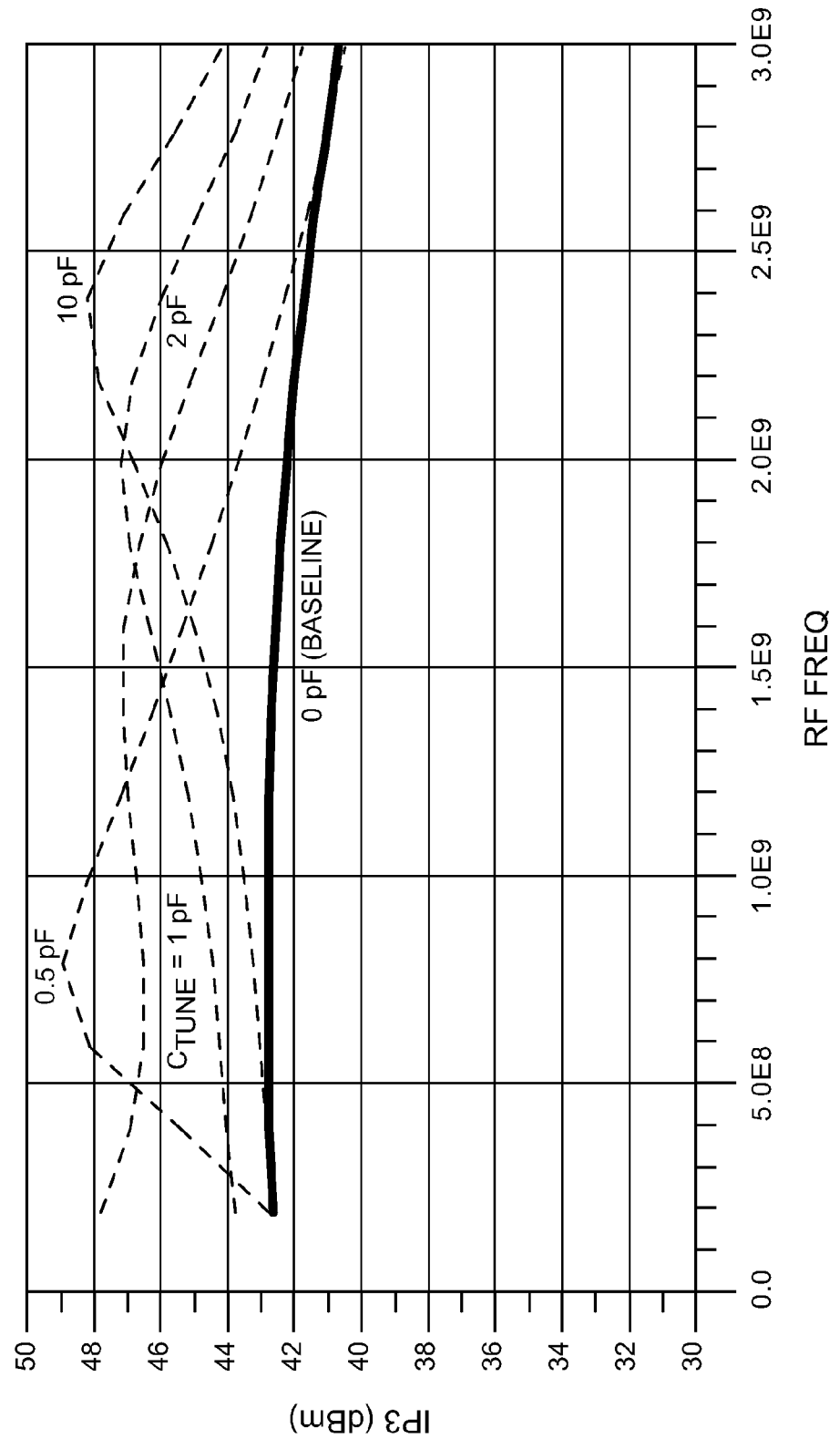
FIG. 10 is a graph showing IP3 simulations for the frequency bias feedback network of FIG. 6 having a fixed tuning resistor value and swept capacitance values for the tuning capacitor.

FIG. 10 is a graph showing IP3 simulations for the frequency bias feedback network 36 (FIGS. 6 and 7) having a fixed tuning resistor value and swept capacitance values for the tuning capacitor. The graph of FIG. 10 provides simulated IP3 vs. frequency response for the linear FET feedback amplifier 28 for a fixed $R_{TUNE}$ of 100Ω and swept capacitance values for the capacitor $C_{TUNE}$. Two tone IP3 measurements were done with a difference frequency of 1.3 MHz with output tones of 0 dBm. The graph shows the IP3 versus frequency performance for various values of capacitance for $C_{TUNE}$ and compares the various improvements to a baseline case where the capacitance of $C_{TUNE}$ is equal to 0 pF. A desired effect of reducing the size of $C_{TUNE}$ is to improve the lower frequency IP3 response. At an intermediate value of 1 pF, the response shows a broad IP3 frequency response with an average IP3 improvement of 3 dB to 4 dB from 200 MHz up to 1.5 GHz. A nominal IP3 of 47 dBm is achieved from a 5V source while drawing 105 mA of source current.

Figure 11:
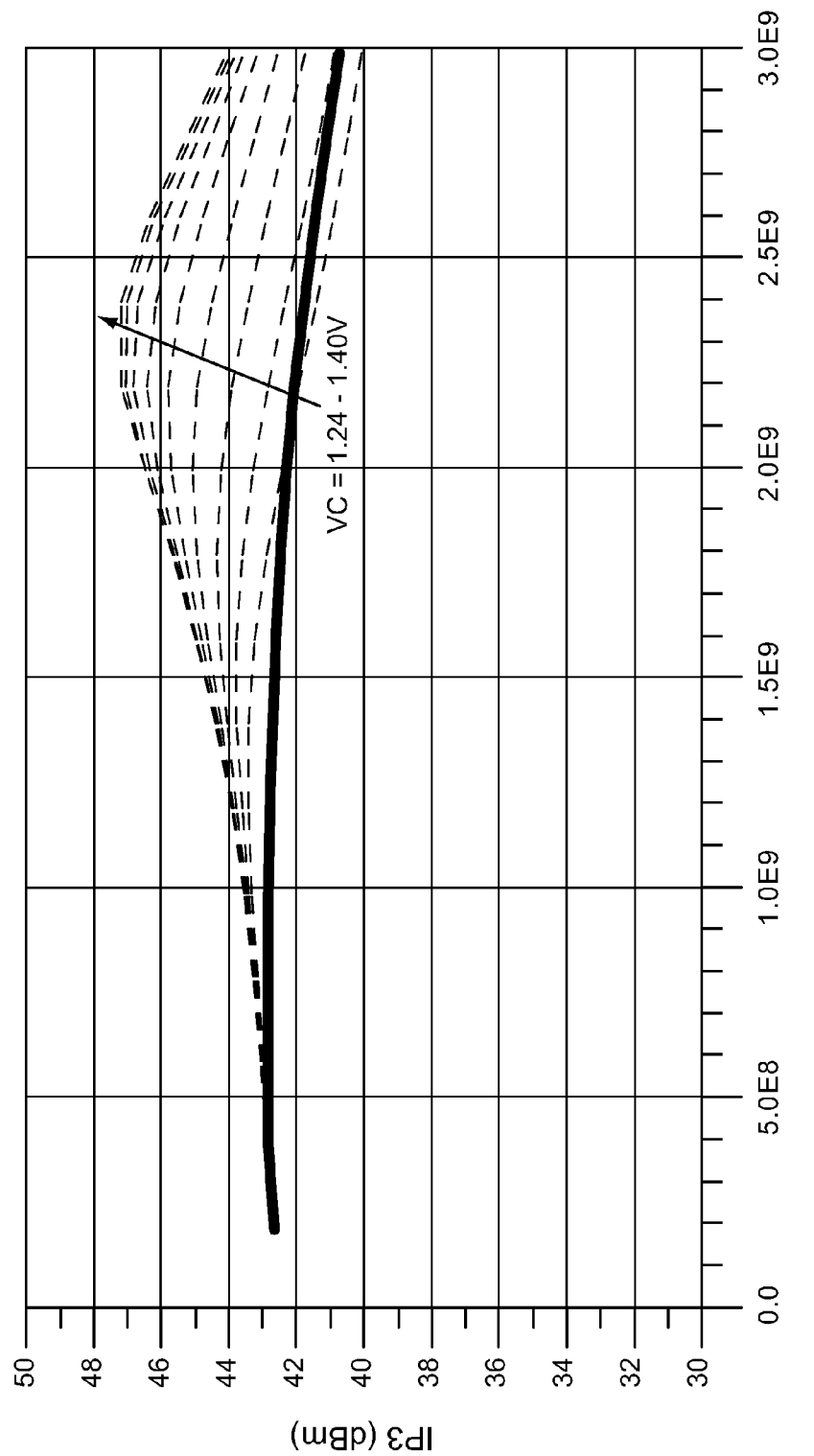
FIG. 11 is a graph showing IP3 simulations for the frequency bias network of FIG. 7 having a fixed tuning capacitor value with varistor tuning.

FIG. 11 is a graph showing IP3 simulations for the frequency bias network of FIG. 7 having a fixed tuning capacitor value with varistor tuning. The graph of FIG. 11 provides simulated IP3 versus frequency response of the linear FET feedback amplifier 28 having a fixed capacitance equal to 10 pF for the tuning capacitor $C_{TUNE}$. Two tone IP3 measurements were performed with a difference frequency of 1.3 MHz with output tones of 0 dBm. The graph shows the IP3 versus frequency performance for various values of tuning voltage, which is swept from 1.24V to 1.40V. Results depicted on the graph show an improvement of as much as 5 dB at a frequency of 2.3 GHz. The simulations depicted on the graph include nonlinearities attributable to the FET varistor S1.

Figure 12:
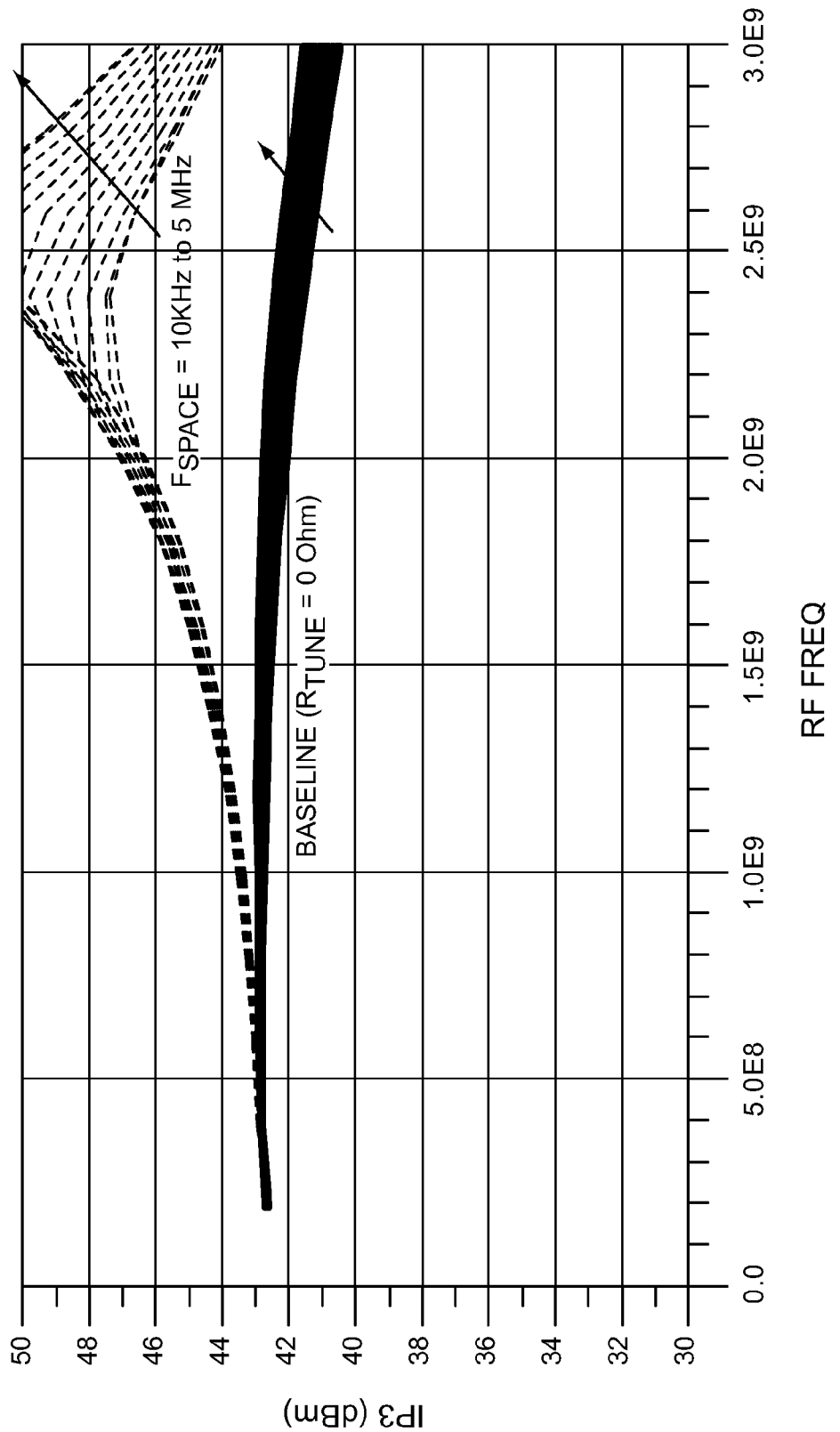
FIG. 12 is a graph depicting IP3 sensitivity to tone spacing over frequency for the linear FET feedback amplifier of FIG. 6.

FIG. 12 is a graph depicting IP3 sensitivity to tone spacing over frequency for the linear FET feedback amplifier 28 (FIG. 6). The graph of FIG. 12 shows the IP3 sensitivity to tone spacing over frequency in comparison to a baseline performance and illustrates that the linear FET feedback amplifier 28 can maintain an advantage of about 4 dB of IP3 improvement at 2.3 GHz over swept tone spacings from 10 kHz to 5 MHz. Moreover, the linear FET feedback amplifier 28 achieves at least a 3 dB improvement over the enhanced frequency range from 2 GHz to 2.7 GHz.

Figure 13:
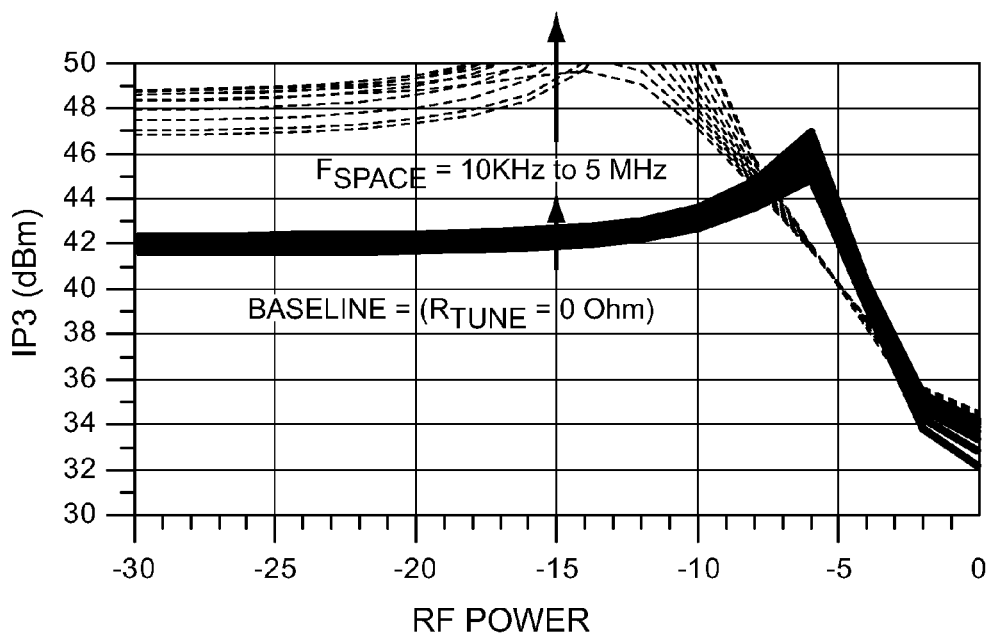
FIG. 13 is a graph depicting IP3 sensitivity to tone spacing and power level for the linear FET feedback amplifier of FIG. 6.

FIG. 13 is a graph depicting IP3 sensitivity to tone spacing and power level for the linear FET feedback amplifier 28 of FIG. 6. FIG. 13 illustrates the IP3 improvements over swept tone spacing and input power levels. An IP3 benchmark is typically specified at Pout=0 dBm. Since there is 15.5 dB of gain, this would correspond to an input power of about −15 dBm input power. An IP3 improvement of greater than 6 dB is maintained over tone spacing at an RF input power of −15 dBm.

Figure 14:
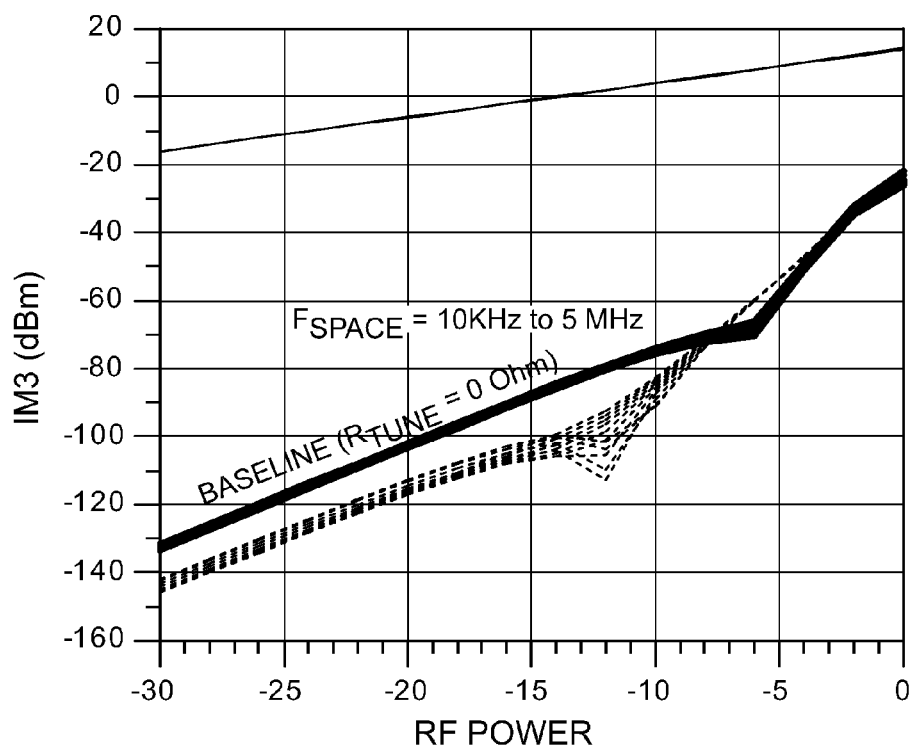
FIG. 14 is a graph depicting detailed third order intermodulation (IM3) sensitivity to tone spacing and power level for the linear FET feedback amplifier of FIG. 6.

FIG. 14 is a graph depicting detailed IM3 sensitivity to tone spacing and power level for the linear FET feedback amplifier 28 of FIG. 6. The detailed POUT and IM3 graphs show that the linear FET feedback amplifier 28 significantly improves the IM3 suppressing up to an RF input power of −10 dBm (Pout=5.5 dBm, exceeding the typical gain block spec of Pout=0 dBm) while maintaining the IM3 3:1 slope over power. This validates that the linearization is fundamentally sound and works over at least the 20 dB of dynamic range indicated in FIG. 14.

Figure 15:
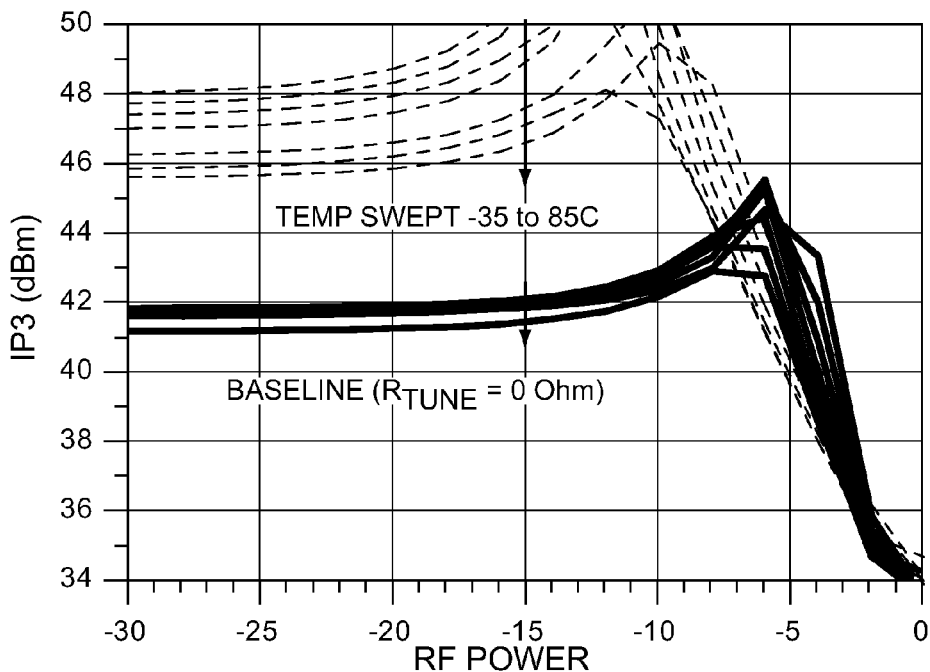
FIG. 15 is a graph depicting IP3 sensitivity to temperature and power level for the linear FET feedback amplifier of FIG. 6.

FIG. 15 is a graph depicting IP3 sensitivity to temperature and power level for the linear FET feedback amplifier 28 of FIG. 6. An IP3 benchmark is typically specified for an output power (POUT) that is 0 dBm. Since there is 15.5 dB of gain, this would correspond to an input power of about −15 dBm input power. As illustrated graphically in FIG. 15, an IP3 improvement that is greater than 3 dB is maintained over temperature at an RF input power of −15 dBm.

Figure 16:
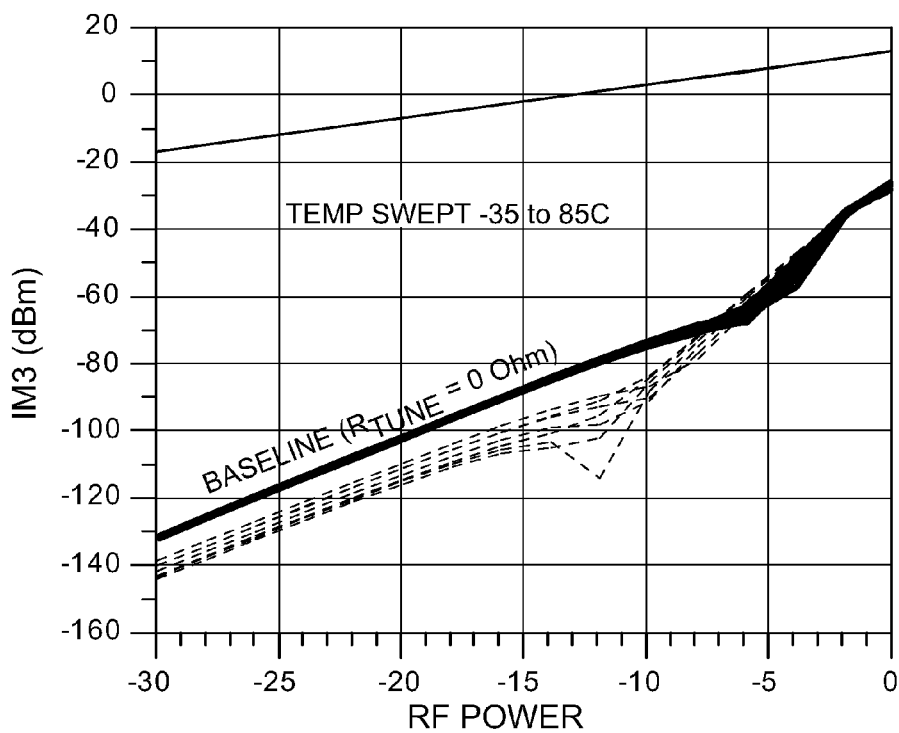
FIG. 16 is a graph depicting IM3 sensitivity to temperature and power level for the linear FET feedback amplifier of FIG. 6.

FIG. 16 is a graph depicting IM3 sensitivity to temperature and power level for the linear FET feedback amplifier 28 of FIG. 6. The graph depicting IM3 shows that the linear FET feedback amplifier 28 significantly improves the IM3 suppressing up to an RF input power of −10 dBm with a POUT of at least 5.5 dBm, thereby exceeding the typical gain block specification of a POUT of only 0 dBm while maintaining an IM3 3:1 slope over a desired power range. These results validate that the linearization provide by the linear FET feedback amplifier 28 is fundamentally sound and works over at least the 20 dB of dynamic range as indicated by the graph of FIG. 16.

Figure 17:
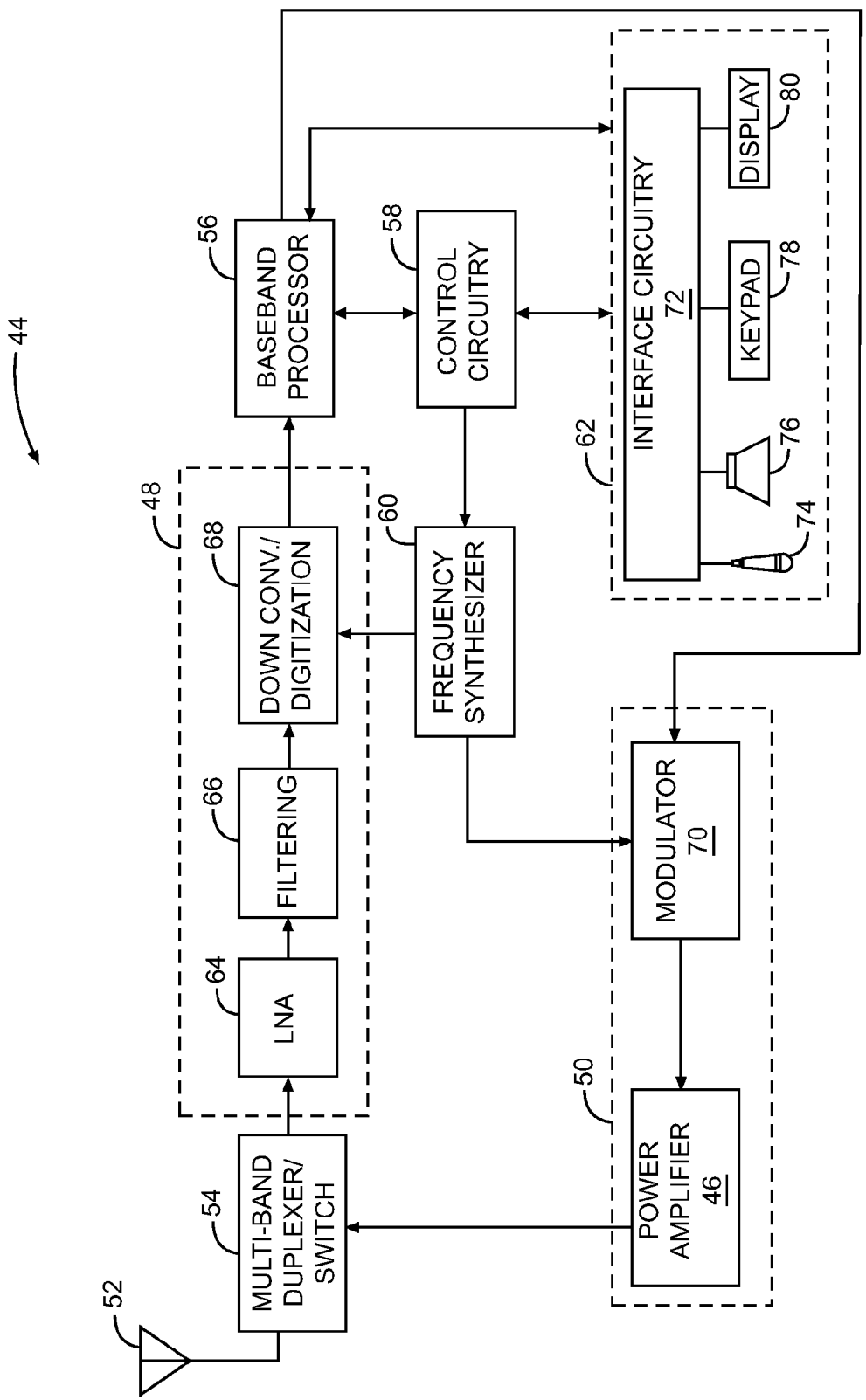
FIG. 17 depicts user equipment (UE) in the form of a mobile terminal that incorporates a preferred embodiment of the linear FET feedback amplifier of FIG. 7.

FIG. 17 depicts the basic architecture of user equipment (UE) in the form of a mobile terminal 44 that incorporates an embodiment of the linear FET feedback amplifier 28 of FIG. 7. In particular, the linear FET feedback amplifier 28 is usable in power amplifier circuitry 46 of the mobile terminal 44. The mobile terminal 44 may include a receiver front end 48, a radio frequency (RF) transmitter section 50, an antenna 52, a duplexer or switch 54, a baseband processor 56, a control system 58, a frequency synthesizer 60, and an interface 62. The receiver front end 48 receives information bearing radio frequency signals from one or more remote transmitters provided by a base station (not shown). The linear FET feedback amplifier 28 is also usable in a low noise amplifier (LNA) 64 that amplifies a received signal. A filter circuit 66 minimizes broadband interference in the received signal, while down conversion and digitization circuitry 68 down converts the filtered, received signal to an intermediate or baseband frequency signal, which is then digitized into one or more digital streams. The down conversion and digitization circuitry 68 may include an intermediate frequency (IF) amplifier comprised of the linear FET feedback amplifier 28. The receiver front end 48 typically uses one or more mixing frequencies generated by the frequency synthesizer 60. The baseband processor 56 processes the digitized received signal to extract the information or data bits conveyed in the received signal. This processing typically comprises demodulation, decoding, and error correction operations. As such, the baseband processor 56 is generally implemented in one or more digital signal processors (DSPs).

On the transmit side, the baseband processor 56 receives digitized data, which may represent voice, data, or control information, from the control system 58, which it encodes for transmission. The encoded data is output to the RF transmitter section 50, where it is used by a modulator 70 to modulate a carrier signal that is at a desired transmit frequency. The power amplifier circuitry 46 amplifies the modulated carrier signal to a level appropriate for transmission, and delivers the amplified and modulated carrier signal to the antenna 52 through the duplexer or switch 54.

A user may interact with the mobile terminal 44 via the interface 62, which may include interface circuitry 72 associated with a microphone 74, a speaker 76, a keypad 78, and a display 80. The interface circuitry 72 typically includes analog-to-digital converters, digital-to-analog converters, amplifiers, and the like. Additionally, it may include a voice encoder/decoder, in which case it may communicate directly with the baseband processor 56. The microphone 74 will typically convert audio input, such as the user's voice, into an electrical signal, which is then digitized and passed directly or indirectly to the baseband processor 56. Audio information encoded in the received signal is recovered by the baseband processor 56, and converted by the interface circuitry 72 into an analog signal suitable for driving the speaker 76. The keypad 78 and the display 80 enable the user to interact with the mobile terminal 44, input numbers to be dialed, address book information, or the like, as well as monitor call progress information.

Those skilled in the art will recognize improvements and modifications to the preferred embodiments of the present disclosure. All such improvements and modifications are considered within the scope of the concepts disclosed herein and the claims that follow.

What is claimed is:

1. A circuit comprising:
   a Darlington transistor pair having an input transistor and an output transistor configured to generate an output signal at an output node in response to an input signal received through an input node;
   a frequency bias feedback network communicatively coupled between the output transistor and the input node for providing biasing to the Darlington transistor pair as well as for adjusting a phase and amplitude of an amplified version of the input signal that passes through the input transistor and into the frequency bias feedback network, wherein the frequency bias network comprises:
      a bias transistor coupled between a feedback coupling network and a fixed voltage node; and
      an electronically controllable phase shifter and amplitude attenuator that is responsive to a control signal and tunable within a ramie that increases a third order intercept point (IP3) to improve an upper frequency band linearity; and
   the feedback coupling network coupled between the output node and the input node for feeding back to the input node a portion of the amplified version of the input signal that passes through the input transistor.

2. The circuit of claim 1, wherein the portion of the amplified version of the input signal that passes through the input transistor is phase and amplitude adjusted.

3. The circuit of claim 1, wherein the output signal is fed back to the input node via the feedback coupling network.

4. The circuit of claim 1, wherein the electronically controllable phase shifter and amplitude attenuator is a resistor capacitor (RC) network made up of a variable resistor and a capacitor having a fixed capacitance value, wherein the variable resistor changes resistance in response to the control signal.

5. The circuit of claim 4, wherein the variable resistor is a field effect transistor (FET) coupled in series with a gate of the bias transistor.

6. The circuit of claim 1, wherein the electronically controllable phase shifter and amplitude attenuator is an RC network made up of a resistor having a fixed resistance value and a variable capacitor that changes capacitance in response to the control signal.

7. The circuit of claim 6, wherein the variable capacitor is tunable within a range that increases IP3 to improve an upper frequency band linearity.

8. The circuit of claim 6, wherein the variable capacitor is a varactor diode.

9. The circuit of claim 1, wherein the electronically controllable phase shifter and amplitude attenuator is an RC network made up of a variable resistor that changes resistance in response to the control signal and a variable capacitor that changes capacitance in response to a second control signal.

10. The circuit of claim 9, wherein the variable resistor is tunable to a resistance value and the variable capacitor is tunable to a capacitance value that suppress intermodulation (IM) distortion at the output node of the transistor.

11. The circuit of claim 1, wherein the feedback coupling network includes a pair of split feedback resistors coupled at a tap point that is communicatively coupled to the bias transistor.

12. A mobile terminal comprising:
   an antenna;
   a duplexer/switch coupled to the antenna;
   amplifier circuitry selectively coupled to the antenna through the duplexer/switch, the amplifier circuitry comprising:
      a Darlington transistor pair having an input transistor and an output transistor configured to generate an output signal at an output node in response to an input signal received through an input node;
      a frequency bias feedback network communicatively coupled between the output transistor and the input node for providing biasing to the Darlington transistor pair as well as for adjusting a phase and amplitude of an amplified version of the input signal that passes through the input transistor and into the frequency bias feedback network:
      a feedback coupling network coupled between the output node and the input node for feeding back to the input node a portion of the amplified version of the input signal that passes through the input transistor;
      a bias transistor coupled between the feedback coupling network and a fixed voltage node; and
      an electronically controllable phase shifter and amplitude attenuator that is responsive to a control signal and tunable within a range that increases a third order intercept point (IP3) to improve an upper frequency band linearity; and
   a control system for controlling the electronically controllable phase shifter and amplitude attenuator.

13. The circuit of claim 12, wherein the portion of the amplified version of the input signal that passes through the input transistor is phase and amplitude adjusted.

14. The circuit of claim 12, wherein the output signal is fed back to the input node via the feedback coupling network.

15. The mobile terminal of claim 12, further including a radio frequency (RF) transmitter section that includes the amplifier circuitry and wherein the amplifier circuitry is power amplifier circuitry.

16. The mobile terminal of claim 12, further including a receiver front end that includes the amplifier circuitry and wherein the amplifier circuitry comprises a low noise amplifier (LNA).

17. The mobile terminal of claim 12, further including a receiver front end that includes the amplifier circuitry and wherein the amplifier circuitry comprises an intermediate frequency (IF) amplifier.

18. The mobile terminal of claim 12, wherein the electronically controllable phase shifter and amplitude attenuator is a resistor capacitor (RC) network made up of a variable resistor and a capacitor having a fixed capacitance value, wherein the variable resistor changes resistance in response to the control signal.

19. The mobile terminal of claim 18, wherein the variable resistor is a FET coupled in series with a gate of the bias transistor.

20. The mobile terminal of claim 12, wherein the electronically controllable phase shifter arid amplitude attenuator is an RC network made up of a resistor having a fixed resistance value and a variable capacitor that changes capacitance in response to the control signal.

21. The mobile terminal of claim 20, wherein the variable capacitor is a varactor diode.

22. The mobile terminal of claim 12, wherein the electronically controllable phase shifter and amplitude attenuator is an RC network made up of a variable resistor that changes resistance in response to the control signal and a variable capacitor that changes capacitance in response to a second control signal, 23. The mobile terminal of claim 22, wherein the variable resistor is tunable to a resistance value and the variable capacitor is tunable to a capacitance value that suppresses intermodulation (IM) distortion at the output node of the output transistor.

24. The mobile terminal of claim 12, wherein the feedback coupling network includes a pair of split feedback resistors coupled at a tap point that is communicatively coupled to the bias transistor.

25. A circuit comprising:
  a Darlington transistor pair having an input transistor and an output transistor configured to generate an output signal at an output node in response to an input signal received through an input node;
  a frequency bias feedback network communicatively coupled between the output transistor and the input node for providing biasing to the Darlington transistor pair as well as for adjusting a phase and amplitude of an amplified version of the input signal that passes through the input transistor and into the frequency bias feedback network, wherein the frequency bias network comprises:
    a bias transistor coupled between a feedback coupling network and a fixed voltage node; and
    an electronically controllable phase shifter and amplitude attenuator that is responsive to a control signal and tunable within a range that suppresses intermodulation (IM) distortion at the output node of the transistor; and
  the feedback coupling network coupled between the output node and the input node for feeding back to the input node a portion of the amplified version of the input signal that passes through the input transistor.

* * * * *

UNITED STATES PATENT AND TRADEMARK OFFICE
CERTIFICATE OF CORRECTION

PATENT NO. : 8,390,380 B2
APPLICATION NO. : 13/099636
DATED : March 5, 2013
INVENTOR(S) : Kevin Wesley Kobayashi It is certified that error appears in the above-identified patent and that said Letters Patent is hereby corrected as shown below:

In the Claims:

In claim 1, column 11, line 22, change "ramie" to --range--.

In claim 22, column 12, line 67, change "signal," to --signal.--.

Signed and Sealed this
Ninth Day of July, 2013

Teresa Stanek Rea
*Acting Director of the United States Patent and Trademark Office*